United States Patent [19]

Patillon et al.

[11] Patent Number: 5,936,385
[45] Date of Patent: Aug. 10, 1999

[54] SYSTEM MONITORING THE DISCHARGING PERIOD OF THE CHARGING/DISCHARGING CYCLES OF A RECHARGEABLE BATTERY, AND HOST DEVICE INCLUDING A SMART BATTERY

[75] Inventors: Jean-Noël Patillon, Paris; Florence D'Alche-Buc, Antony; Jean-Pierre Nadal, Paris, all of France

[73] Assignee: U.S. Philips Corporation, New York, N.Y.

[21] Appl. No.: 08/739,770

[22] Filed: Oct. 30, 1996

[30] Foreign Application Priority Data

Oct. 31, 1995 [FR] France ................................... 95 12863

[51] Int. Cl.$^6$ ........................................................ H02J 7/00
[52] U.S. Cl. ............................ 320/136; 320/134; 320/130
[58] Field of Search ....................................... 320/106, 107, 320/134, 135, 136, 132, DIG. 21, 151, 152, 130

[56] References Cited

U.S. PATENT DOCUMENTS 5,525,890  6/1996  Iwatsu et al. ..................... 320/DIG. 21
5,565,759  10/1996 Dunstan ................................... 320/135
5,615,129  3/1997  Stich et al. ......................... 320/DIG. 21
5,633,573  5/1997  Van Phouc et al. ..................... 320/152
5,714,866  2/1998  S et al. ..................................... 320/152

OTHER PUBLICATIONS

"Adaptive System for Samrt Battery Management Based on Neural Networks" by Olivier Gerard, Sep. 1995.

Primary Examiner—Peter S. Wong
Assistant Examiner—K. Shin
Attorney, Agent, or Firm—Steven R. Biren

[57] ABSTRACT

A system for monitoring the discharging/charging cycles of a rechargeable battery which includes adaptive calculation means for providing a predictive indication of when the battery will reach a critical discharge voltage. The adaptive calculation means includes parameters which can be modified by other adaptive calculation means so as to optimize the monitor's performance depending on the battery's actual use. The adaptive calculation means may be neural networks formed by a microprocessor and memory, and the monitor system may be coupled to a host system.

20 Claims, 10 Drawing Sheets

SYSTEM MONITORING THE DISCHARGING PERIOD OF THE CHARGING/DISCHARGING CYCLES OF A RECHARGEABLE BATTERY, AND HOST DEVICE INCLUDING A SMART BATTERY

FIELD OF THE INVENTION

The invention relates to a monitoring system for monitoring the discharging period of the charging/discharging cycles of a rechargeable battery to form a smart battery. The invention likewise relates to a host device which includes a smart battery.

The invention finds its application in the field of modular apparatus equipped with a rechargeable battery such as, for example: private or professional cellular telephones, cordless tools, portable computers, toys, etc.

A smart battery is generally understood to mean a rechargeable battery coupled to a system that monitors its state of charge. This system comprises means for collecting data on the state of charge of the battery and means for producing calculated predictive information signals relating to the discharging conditions in the future.

A technical problem posed when predictive information signals about the discharging conditions in the future are determined for a rechargeable battery depends on the variability of the manufacturing parameters of the battery and on the variability of the habits of the user of the host device.

The individual variability of the manufacturing parameters of the battery is due to the spreading of the structure data during manufacturing for the same type of battery.

The variability of the user habits leads to improper use which may damage the battery and affect the later recharging possibilities. These habits of improper use comprise charging for too long a lapse of time, or frequent recharging of a battery that is hardly discharged.

Another technical problem also depends on the fact that the current applications of the rechargeable batteries require very high precision relating to the amount of energy available at a given instant.

BACKGROUND OF THE INVENTION

A system for monitoring the state of charge of a battery, utilizing a neural network, is already known from the publication entitled "NEURAL NETWORK, A PROPER APPROACH TO THE ENERGY MANAGEMENT PROBLEM", by MARCUS STOLL IN "10TH EUROPEAN PHOTOVOLTAIC SOLAR ENERGY CONFERENCE", 8–10 Apr. 1991, LISBON. PORTUGAL, pages 427–430.

The cited publication describes the use of a neural network for undertaking the task of estimating the state of charge (SOC) of a lead-acid battery in a recharging system (RES). According to the cited document, determining the state of charge (SOC) is an important task that is to be carried out to monitor the energy level of a battery. More particularly, the estimation of the state of charge makes it possible to plan the use of the renewable energy, to optimize the conditions of use of a host device, and to make decisions concerning the various periods of the charging/discharging cycles of the battery.

A neural network is involved in estimating the state of charge (SOC) via a data base. To reduce the cost, the neural network is involved in only a small part of the discharging domain of the battery. As the discharge current is very small during most of the time, the involvement of the neural network lies in this domain.

In the learning period of the neural network a data base is used including the discharge current, the discharge voltage and the state of charge under standard conditions of use, that is to say, at a fixed temperature of 20° C. and with a fixed current. In addition, this data base may include information relating to discharging cycles and to what degree the discharge has taken place and relating to the average temperature of the battery. The various batches of these data, which form input vectors, are applied to the neural network to inform the network of the discharging behavior of the batteries. The neural network is arranged for a suitable representation of the behavior of the battery.

In the classification period of the neural network, only the discharge current and voltage are applied thereto and it produces on its output the corresponding state of charge of the battery.

A problem which results from the use of the known system is that this system is unable to predict forthwith the lapse of time that is left before a critical discharge voltage threshold is reached.

Another problem which results from the use of the known system is that the data corresponding to the number of previous charging/discharging cycles and to the degree of discharge in these cycles, cannot be correctly taken into account. Indeed, these data are highly variable as a function of the actual use that is made of the battery during operation, and largely influence the real state of charge present in the battery at a given instant of a discharging cycle, whereas in the known system of the cited document the weights of the neural network are ultimately fixed from the end of the learning period onwards.

SUMMARY OF THE INVENTION

It is an object of the present invention to provide a system for monitoring the discharging period of the battery charging/discharging cycles of a rechargeable battery which produces predictive information relating to the instant at which a predetermined critical threshold of the battery discharge voltage will be reached and, more particularly, produces predictive information relating to the remaining lapse of time that is left from each current instant of use onwards until the instant at which this predetermined critical threshold of discharge voltage will be reached.

It is an object of the present invention to provide a system for monitoring the discharging period of the battery charging/discharging cycles which produces such predictive information that automatically adapts itself to new voltage data which vary with each discharging period of the battery as a function of the number of charging/discharging cycles already effected previously and as a function of an average behavior of the type of the respective battery.

These problems are resolved by a monitoring system for monitoring the discharging period of the charging/discharging cycles of a battery coupled to a rechargeable battery having charging periods alternating with discharging periods according to charging/discharging cycles, this system comprising:

first adaptive calculation means which are arranged for collecting, at an initial instant at the beginning of a discharging period of a charging/discharging cycle of the battery, a predetermined value of a critical discharge voltage threshold, and for calculating and providing a predictive indication of a critical instant at which the battery will reach this critical, predetermined discharge voltage threshold, second adaptive calculation means coupled to the first calculation means, which are arranged for collecting, at the initial instant, a measured value of an initial voltage, of an initial variation of the voltage at a later instant after a short lapse of time starting from this initial instant onwards, and of the initial number of charging/discharging cycles of this battery effected before this initial instant, and arranged for calculating and producing from the instant of said discharging period at which the initial values are available onwards, operating parameters which are automatically adapted to the values of the initial measurements to be imposed on the first calculation means.

These problems are particularly resolved by a system such as defined previously, in which the first adaptive calculation means are also arranged for collecting, at a current instant during the respective discharging period of the charging/discharging cycle of the battery in operation, a temperature measurement, and for calculating and providing at this current instant a predictive indication of a critical instant at which the battery will reach the predetermined critical discharge voltage threshold.

These problems are particularly resolved by either one of the two above monitoring systems, in which the first adaptive calculation means are also arranged for calculating and providing at each current instant a predictive indication of the lapse of time that is left from this current instant onwards till the instant at which the battery will reach the predetermined critical discharge voltage threshold.

In a particular embodiment, these problems are resolved by a monitoring system as defined previously, in which the first and second adaptive calculation means are formed by, respectively:

a first neural network arranged for calculating and providing at each current instant a predictive indication of the lapse of time that is left from this current instant onwards till the critical instant at which the battery will reach this predetermined critical discharge voltage threshold, on the basis of the predetermined critical discharge voltage threshold and on the basis of the temperature measurement, a second neural network, combined in series with the first neural network, arranged for calculating and providing automatically adapted synaptic weights to be imposed on the first neural network, on the basis of the initial measurement of the voltage values, of the initial voltage variation and of the initial number of cycles, with each start of a discharging period of each discharging cycle, from the instant of the respective period onwards at which the initial measurements are available.

In another particular embodiment, these problems are resolved by a monitoring system as defined previously in which the first and second adaptive calculation means are respectively formed by:

a first neural network arranged for calculating and providing at each current instant a predictive indication of the lapse of time that is left from this current instant onwards till the critical instant at which the battery will reach this predetermined critical discharge voltage threshold on the basis of the predetermined critical discharge voltage threshold and on the basis of the temperature measurement, a second neural network, combined in series with the first neural network, arranged for calculating and providing automatically adapted synaptic weights to be imposed on the first neural network, on the basis of the initial measurement of the voltage values, of the initial voltage variation and of the initial number of cycles, with each start of a discharging period of each discharging cycle, from the instant of the respective period onwards at which the initial measurements are available.

The advantage of this monitoring system in either one of these two embodiments is that the predictive indications are adapted to the individual charging/discharging characteristics of the battery to which this monitoring system is coupled for a given type of battery; that these predictive indications are very precise and very reliable and that they relate to a measurement which permits the user of operating a host device that comprises such a "smart" battery in the best conditions of use.

In a mode of application of the invention, such a predictive and adaptive monitoring system is coupled to a host system and within this host system the monitoring system is coupled to a rechargeable battery, to time measuring means, voltage measuring means, possibly temperature measuring means, and to display means arranged for providing either an indication of the critical instant at which the battery will reach the critical voltage threshold, or an indication of the lapse of time that is left from a current instant of use onwards till the instant at which the battery will reach a predetermined critical voltage threshold, or the two indications, this monitoring system comprising a microprocessor for carrying out the calculations, and memory areas for storing the data, these memory areas being accessible via the microprocessor and including a ROM memory area for storing the structure data of the neural networks, the fixed parameters and the synaptic coefficients of the second neural network, and a RAM memory area for recording or producing the variable measurements and the synaptic coefficients of the first neural network.

The advantage of this system is that it is simple to use. The host device coupled to this system performs particularly well.

BRIEF DESCRIPTION OF THE DRAWINGS

The invention is described in more detail with reference to the accompanying drawings, of which

DESCRIPTION OF PREFERRED EMBODIMENTS

Figure 5A:
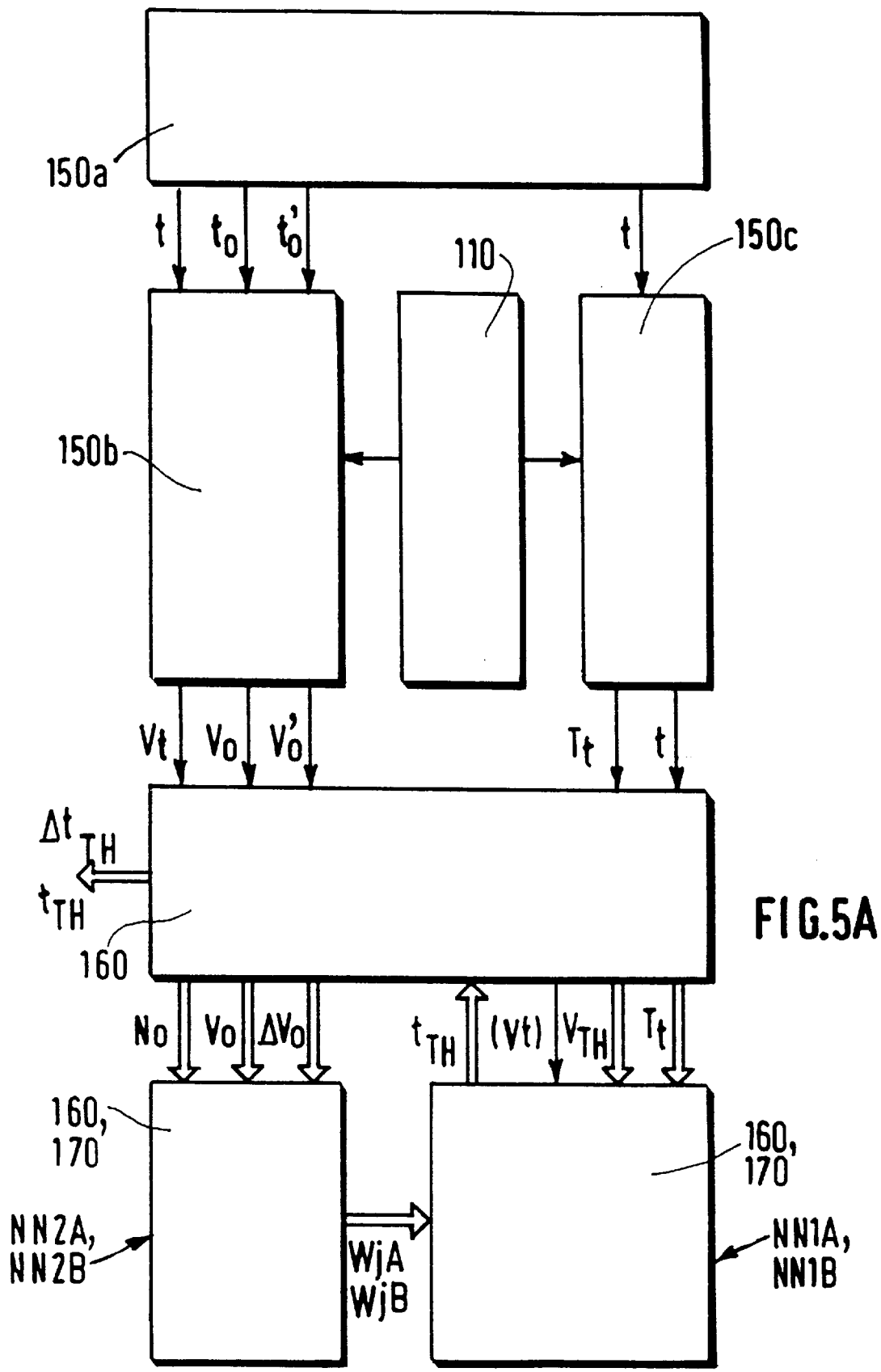
FIG. 5A represents the elements for operating a monitoring system.
Figure 5B:
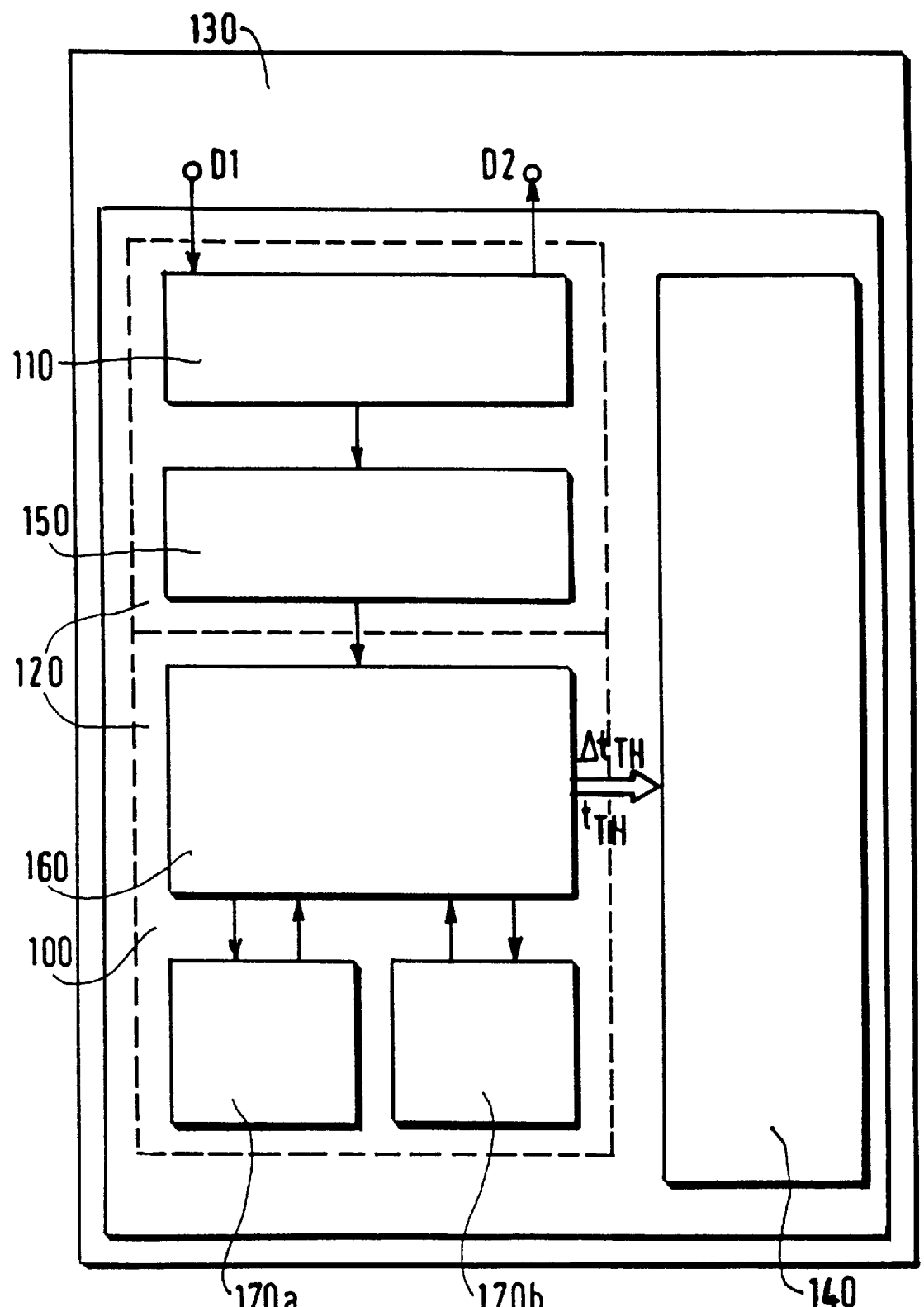
FIG. 5B represents a monitoring system in a host system.

With reference to FIG. 5B of which the legend is stated in Table II, a monitoring system 100 is coupled to a rechargeable battery 110 to form a total system called smart battery 120. This rechargeable battery has charging periods alternating with discharging periods in charging/discharging cycles. This smart battery 120 is coupled to, or incorporated in, a host device 130 which comprises battery measuring means 140 for giving the user an indication of an instant $t_{TH}$ in a discharging period at which the battery voltage will reach a predetermined critical voltage threshold $V_{TH}$ and, more particularly, an indication of the lapse of time $\Delta T_{TH}$ that is left before a predetermined critical discharge voltage threshold $V_{TH}$ will be reached, or the two indications.

With reference to FIG. 5A of which the legend is stated in Table I, the monitoring system 100 is coupled to time measuring means 150a, battery voltage measuring means 150b, and possibly to temperature measuring means 150c, and to charging/discharging cycle means 160 which effect the augmentation of the number of charging/discharging cycles which the battery accommodated in the host device 130 undergoes.

Figure 1A:
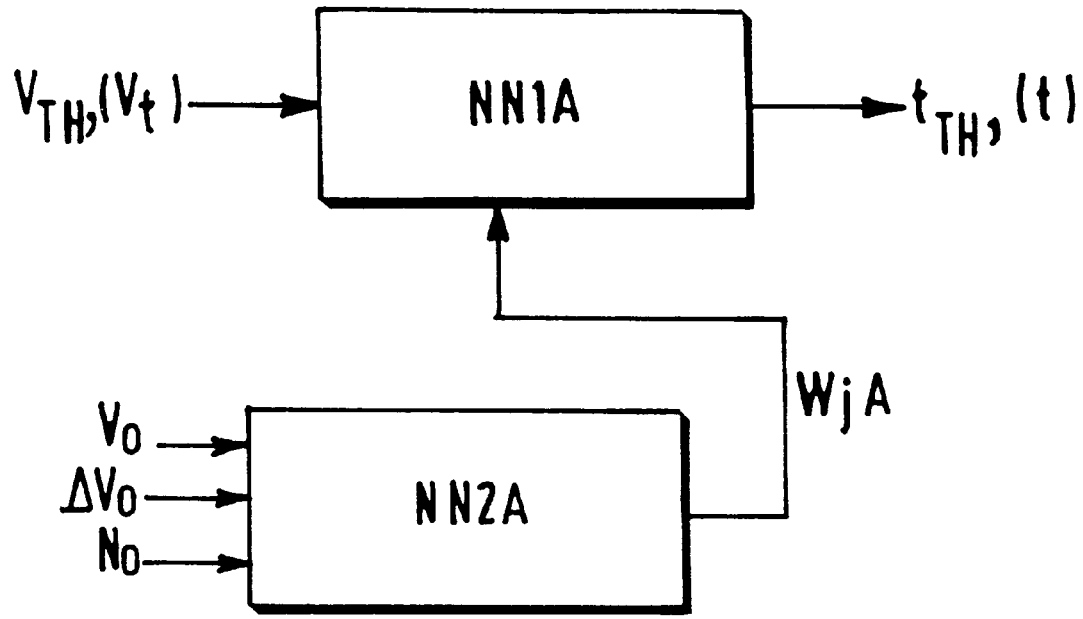
FIG. 1A represents a first monitoring system for a rechargeable battery to form an overall system called smart battery.
Figure 1B:
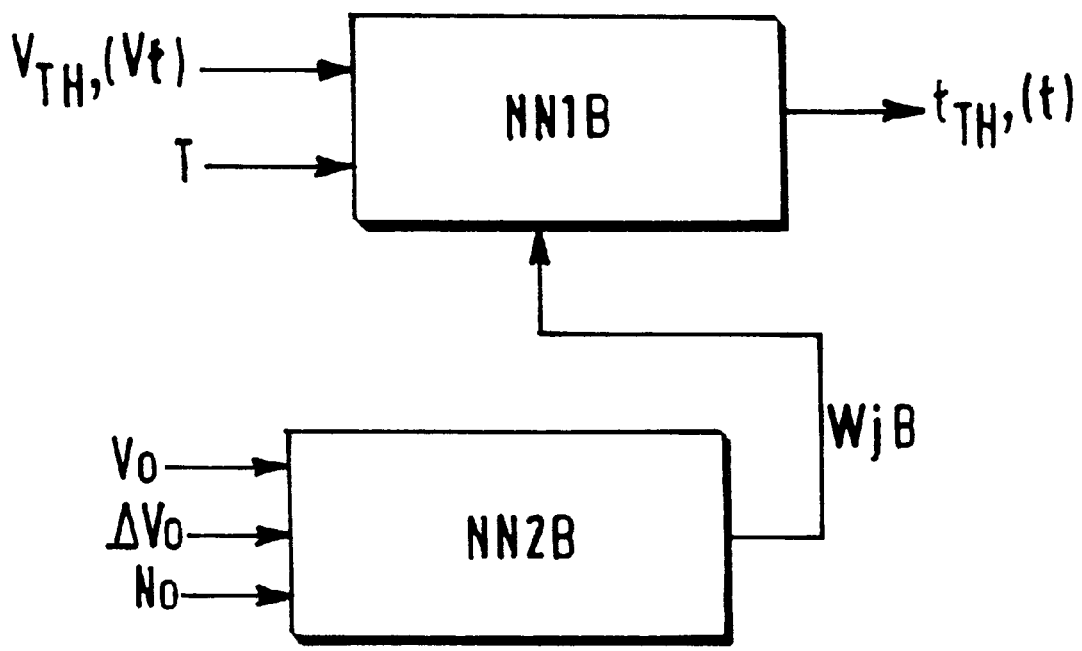
FIG. 1B represents a second monitoring system for a rechargeable battery, to form a smart battery.

With reference to FIGS. 1A and 1B, the monitoring system 100 obtains, on the one hand, values called initial values at an instant called initial instant to, which coincides with the very beginning of a discharging period of the battery in a charging/discharging cycle. These initial values are:

Vo the battery voltage, Vo thus being called initial battery voltage at this initial instant to;

ΔVo the variation of the battery voltage also called initial voltage variation, measured during a first lapse of time Δto which is very short, in which the battery is used between the initial instant to and a later instant t'o= Δto+Δto right at the beginning of the respective discharging period;

No the number of charging/discharging cycles of the battery already effected prior to the respective initial instant to; No may be equal to 0 (zero) as required, if the considered cycle is the first using cycle of the battery, new and never having been recharged.

This system 100 may collect, on the other hand, instantaneous values at each successive current instant t of this discharging period. These instantaneous values are:

Vt the battery voltage at this current instant t. The system 100 may possibly collect at each instant t:

Tt the temperature of the battery.

With reference to FIGS. 1A and 1B, embodiments of a system 100 for monitoring the charging state of a rechargeable battery will be described below.

The monitoring system 100 in essence comprises first and second coupled adaptive and predictive calculation means NN1A and NN2A, or NN1B and NN2B, for providing, on the basis of initial voltage values Vo, ΔVo, No, and on the basis of a critical voltage threshold $V_{TH}$, and possibly on the basis of the instantaneous value Tt measured in a discharging period, the predictive indication of an instant called critical instant $t_{TH}$ at which, in the same discharging period, the battery voltage will reach this critical threshold $V_{TH}$, and more specifically, a predictive indication of the lapse of time $\Delta t_{TH}$ that is still left before this critical discharge voltage threshold $V_{TH}$ is reached, this threshold being predetermined so that before the battery voltage reaches this threshold $V_{TH}$, the host system 130 has operating energy that is precisely known and is situated in a certain range where this energy is correctly adapted to the operation of the host device 130.

EXAMPLE I

As is shown in FIG. 1A, in a first embodiment, the first and second adaptive and predictive calculation means of the monitoring system 100 are formed, respectively, by a first neural network referenced NN1A, and a second neural network referenced NN2A combined in series with the first neural network NN1A.

In the description that follows, a discharging period commencing at an instant to in a charging/discharging cycle is considered first; and a predetermined critical discharge voltage threshold $V_{TH}$ is fixed.

The first neural network NN1A has an input for:

the voltage $V_{TH}$ which forms the predetermined critical threshold, and has an output for producing at each current instant t, for example, every minute:

the instant $t_{TH}$ at which this predetermined critical voltage threshold $V_{TH}$ is reached.

With reference to FIG. 5A of which the legend is stated in Table I, the first neural network NN1A is coupled to time measuring means 150a which produce a measurement of each current instant t, and is coupled to the calculator 160 which produces as a difference between the current instant t and the calculated value of the instant $t_{TH}$:

a value $\Delta t_{TH}$ of the lapse of time that is left until the predetermined critical discharge voltage threshold $V_{TH}$ is reached, in the case where the host device 130 is in normal operation, and where the battery 110 is discharged in normal fashion because of this operation.

There are thirteen synaptic coefficients or weights of this first neural network NN1A and they are referenced WjA where j is an index running from 1 to 13. They are calculated and produced automatically at each current instant t during this discharging period by the second neural network NN2A.

The second neural network NN2A has three inputs for:

Vo the initial voltage measured at the initial instant to of the discharging period, ΔVo the initial variation at an instant to' positioned after a short lapse of time Δto reckoned after the initial instant to, for example, 1 minute, No the initial number of cycles, and now has thirteen inputs for thirteen weights WjA automatically transmitted to the first neural network NN1A at each current instant t.

Each of the neural networks NN1A and NN2A is to be organized (or arranged) for bringing these calculations to a successful issue. With this object in view, each of them is subjected to a learning procedure and to a test procedure called learning periods during which periods their synaptic coefficients are determined and, in certain cases, fixed.

Learning Procedure of the Neural Networks

The task of the first neural network NN1A is to learn discharging curve models. This learning makes it possible to form a relation between the battery discharge voltage denoted Vt and the current instant t at which the battery reaches this voltage Vt. The first neural network NN1A is to form, during its learning period, functions Fw which resolve the relation (1a):

$$t=Fw(Vt) \tag{1a}$$

where w assigned to F symbolizes the fact that the function F is linked with the weights WjA, or synaptic coefficients, of the first neural network NN1A.

The neural network NN1A has been formed to generate a non-linear function Fw.

Figure 2A:
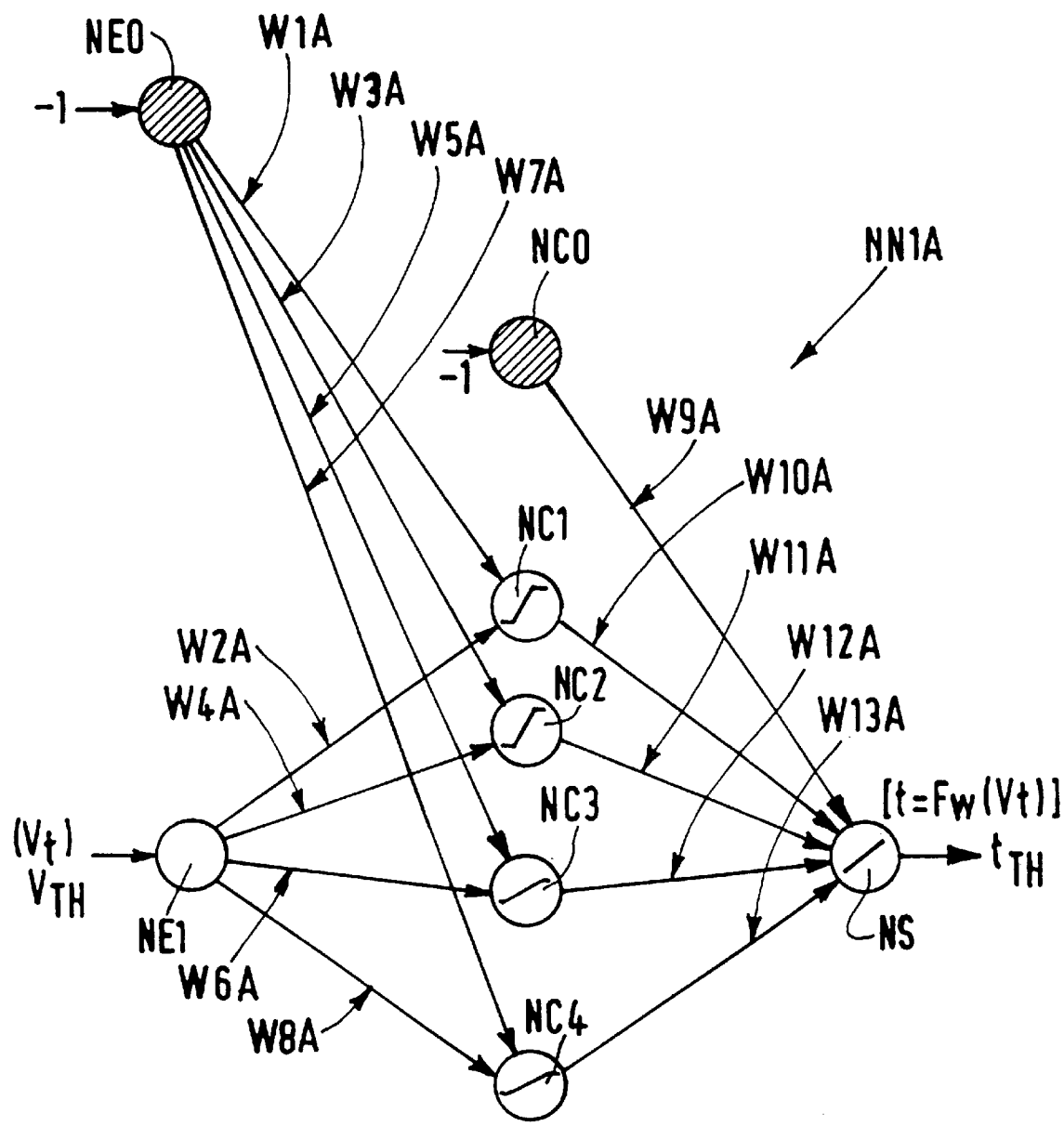
FIG. 2A represents a first neural network NN1A for the first monitoring system.

With reference to FIG. 2A, the first neural network NN1A comprises:

an input layer formed by two neural cells which include a first neural cell NE0 for inputting a threshold voltage selected to be −1, and a second neural cell EC1 for inputting the voltage value Vt at the instant t, a hidden layer of five neural cells which include a first hidden neural cell NC0 for inputting a threshold value selected to be −1, and four hidden neural cells denoted NC1 to NC4, and an output layer which has a sole neural cell denoted NS.

Thus, there is observed that, during the learning procedure of the first neural network NN1A, its input EC1 receives an instantaneous voltage value Vt, whereas this same input receives the value of the critical voltage threshold $V_{TH}$ during current use.

Figure 6A:
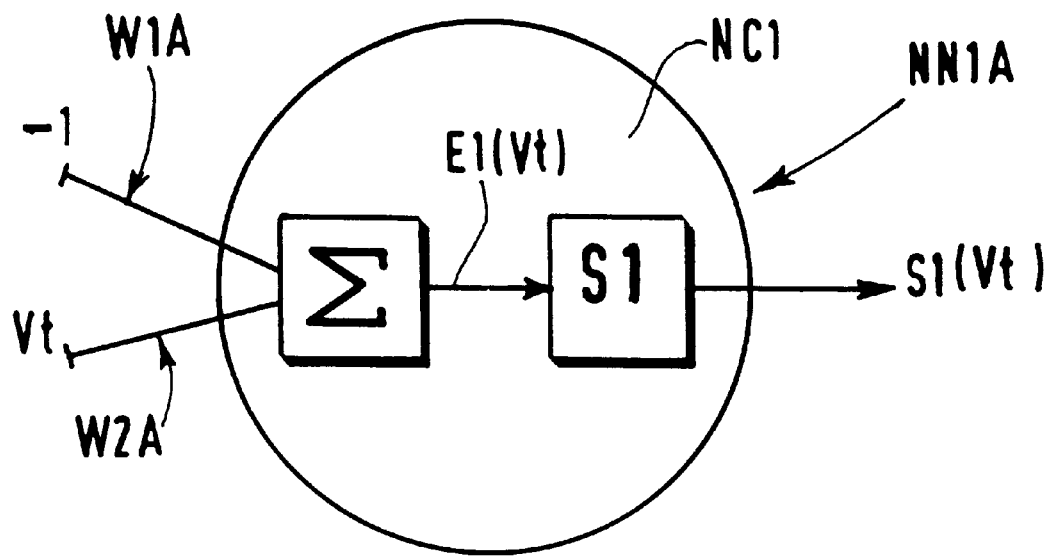
FIG. 6A represents the structure of a neural cell of the hidden layer of the first neural network NN1A of the first monitoring system.

The structure and the operation equation of each hidden neural network, denoted NC1 to NC4, are cells of a formel (standard) neuron, and are illustrated by FIG. 6A which shows the hidden cell NC1 by way of example.

Each given hidden neuron NCi receives on the input the voltage Vt with an input weight or input synaptic coefficient which is one of the thirteen weights referenced WjA, and also receives a threshold which has the constant "−1" as its value, bearing another one of the thirteen weights referenced WjA. The index "i" is the index 1 to 4 of the respective hidden neural cell NC1 to NC4. Each hidden neuron NCi produces a weighted sum denoted Σ of the inputs bearing one of the thirteen weights WjA and calculates an intermediate output signal Ei(Vt).

Each hidden neuron NC1 to NC4 transfers this intermediate output signal Ei(Vt) via an activation function denoted Si and calculates an output signal denoted Si(Vt) in accordance with the relation (2a):

$$Si(Vt)=Si[Ei(Vt)] \quad (2a)$$

The activation function Si(Vt) of each hidden neuron thus remains to be defined better. As a possible activation function may only be adopted a function selected from the set of the non-linear functions.

The activation function Si is preferably a sigmoidal function "tanh", equal to the tangential hyperbolic function which is well adapted to the form of the discharging curves to be made, as will be shown later. In the hidden layer, the 4 neural cells CN1 to CN4 thus show in the described example a non-linear function "tanh".

Figure 6B:
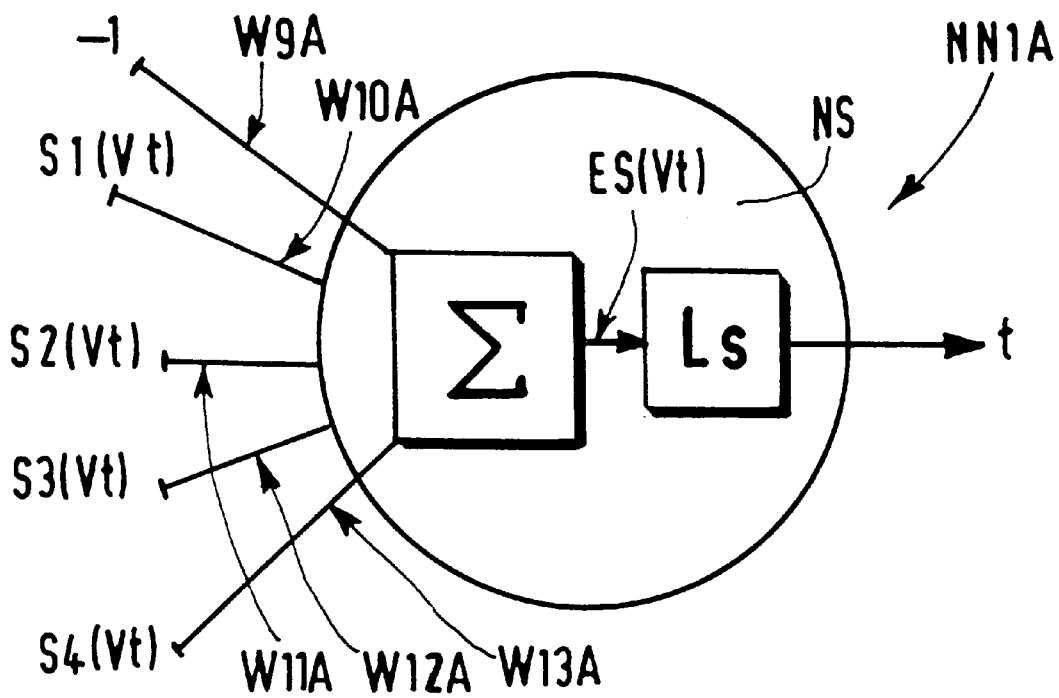
FIG. 6B represents the structure of the neural output cell of this same network NN1A.

The structure of the sole output neuron NS is illustrated by FIG. 6B. A weighted sum is realized, denoted Σ, of the output signals Si(Vt) of all the hidden neurons NCi, by utilizing synaptic coefficients WjA, to which sum is added the value of a "−1" threshold coming from the hidden cell NC0, this threshold value being introduced in the output neuron NS via one of the synaptic coefficients WjA.

This output neuron thus first produces the weighted sum Σ which gives an intermediate output signal Es(Vt).

Then, the neuron of output NS transfers this intermediate output signal Es(Vt) via an activation function denoted Ls, and calculates a final output signal denoted Fw(Vt) according to the relation (3a):

$$Fw(Vt)=Ls[Es(Vt)] \quad (3a)$$

The activation function Ls of this output neuron is selected linearly. The output signal of the output neuron is the function Fw one seeks to generate.

The notations of the weights of each hidden neuron NCi are indicated in FIG. 2A as are the notations of the input weights of the output neuron NS. The set of these weights denoted W1A to W13A is formed by the set of the thirteen weights WjA transmitted by the second neural network NN2A.

Figure 4A:
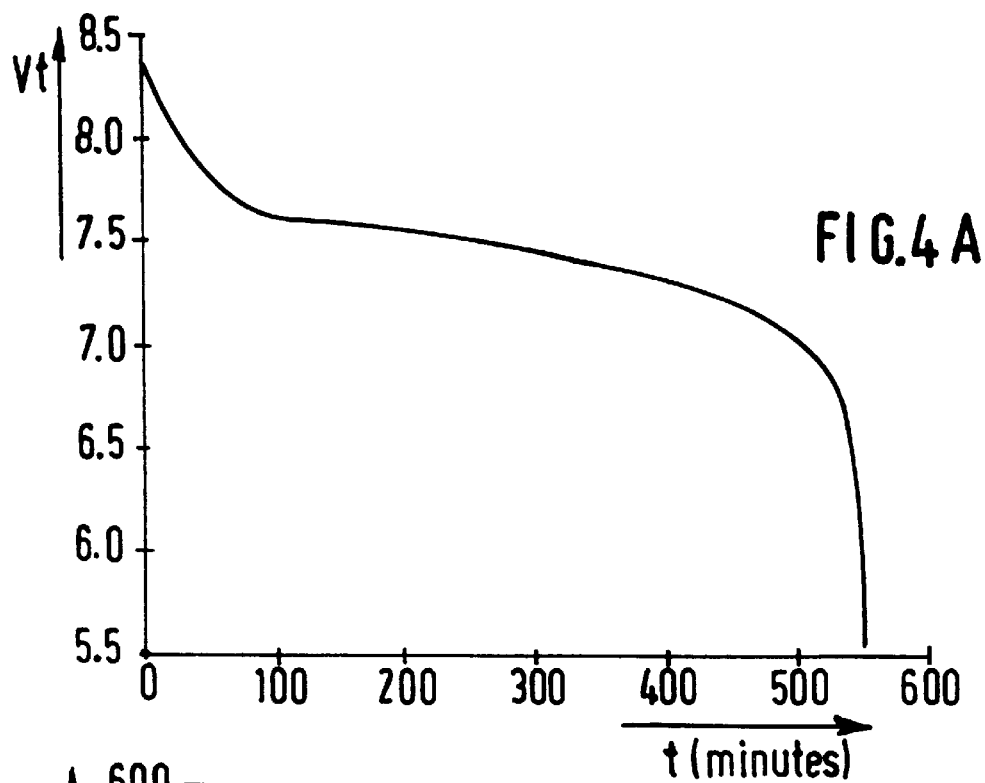
FIG. 4A represents a curve of the discharge voltage of a battery plotted against time.

With reference to FIG. 4A, a conventional discharging curve of a nickel-cadmium battery taken by way of example shows the voltage Vt in volts plotted against time t in minutes. This curve shows a steep slope in the first operating period of the battery, for example, the 100 first minutes, followed by a slight slope between 100 and 500 minutes of use, and finally again a steep slope beyond the 500 minutes. Of course it will be evident that this discharging curve is given totally by way of example.

But, in the present system it will be recollected that the first neural network NN1A is to undergo a learning period which leads to providing a time t which is a function Fw of the voltage Vt of the battery.

Figure 4B:
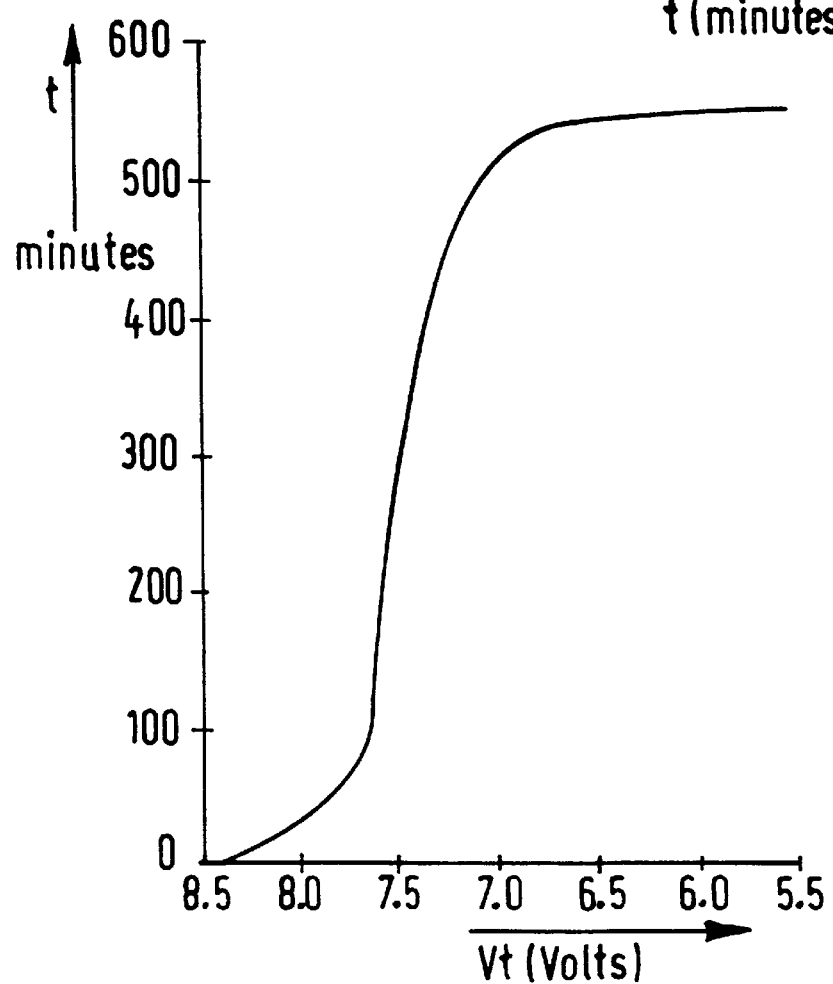
FIG. 4B represents a discharging time curve of a battery plotted against the discharge voltage.

Therefore, an example of a discharging curve which is interesting for the present description is shown in FIG. 4B. This curve shows the time t plotted against the battery voltage Vt. This curve of FIG. 4B is simply plotted by bringing the values which were on the time axis in FIG. 4A to the Y-axis in FIG. 4B; and by bringing the values which were on the Y-axis in FIG. 4A to the time axis in FIG. 4B. It may be found that this discharging curve has a form approaching the form of a curve "tanh". Therefore, the functions of the sigmoidal type are preferred for realizing the activating functions in the neurons of the hidden layer.

FIG. 4B thus shows a discharging curve giving the time t in minutes plotted against the voltage Vt in volts, which shows substantially flat end parts and a central part which has a steep slope. Therefore, the central part of the discharging curves of the relation (1a) is modelled by the two first neural cells CN1, CN2 of the hidden layer, of which the activating functions have a steep slope; whereas the end parts of these curves are modelled by the following hidden neural cells CN3, CN4 which show an activating function which has a less steep slope.

The presence of hidden cells which have activating functions and show slopes which are considerably different amounts to specifying each hidden cell when predetermined different tasks are executed. It will be clear that the neural network NN1A could learn the task of producing the function Fw with the same level of performance, without this specifying. But, according to the invention, it has been found that the learning period of the neural network NN1A is found to be considerably shorter because each cell is dedicated to a predetermined task.

The slopes of the activating functions Si of the hidden cells NC1, NC2 may be, for example, 7,0, and the slopes of the activating functions of the following hidden cells NC2A, NC4 A may be, for example, 2,0.

For the learning period of the first neural network NN1A, curves of discharging time t plotted against the discharge voltage V(t) are recorded, for example, every minute for a large number N of discharging cycles, and for a large number of batteries 110 of the same type, for example, nickel-cadmium batteries.

In an example, 20 batteries are used and undergo 140 charging/discharging cycles. A charging period lasts sixteen hours. A battery is considered fully charged when its voltage Vo=9V, and is considered to have reached the critical discharging threshold when its voltage reaches $V_{TH}$=6V. By this method, 20×140=2800 discharging curves are recorded, so that each curve produces 1600 points.

Each curve shows a different network NN1A. Thus, in the learning period, 2800 networks are initialized, that is to say, one network per curve. In each curve, for example, half of the points, that is to say, 800 points, are used for the learning of the corresponding neural network and, the other half of the points, that is to say, 800 other points, are used for testing said neural network.

At the start of this learning period, which comprises the learning period and the tests, the thirteen weights WjA of each of the 2800 neural networks NN1A are stored in a RAM memory area.

The RAM is referenced 170b in FIG. 5B.

On the basis thereof, the values of the batches of thirteen weights WjA in the memory will form a data base for the learning of the second neural network NN2A.

The task of the second neural network NN2A is to learn a relation between parameters which depend on the battery discharge voltage. Thus, the second neural network NN2A receives:

No the previous number of cycles,

Vo the first recorded voltage of a given discharging curve, and $\Delta$Vo the slope at the start of this discharging curve, and is to be capable of calculating, on the basis of these measurements, the thirteen weights WjA necessary for the operation of the first neural network NN1B. This relation is expressed by the function G of the relation (4a):

$$WjA = G(Vo, \Delta Vo, No) \tag{4a}$$

Figure 2B:
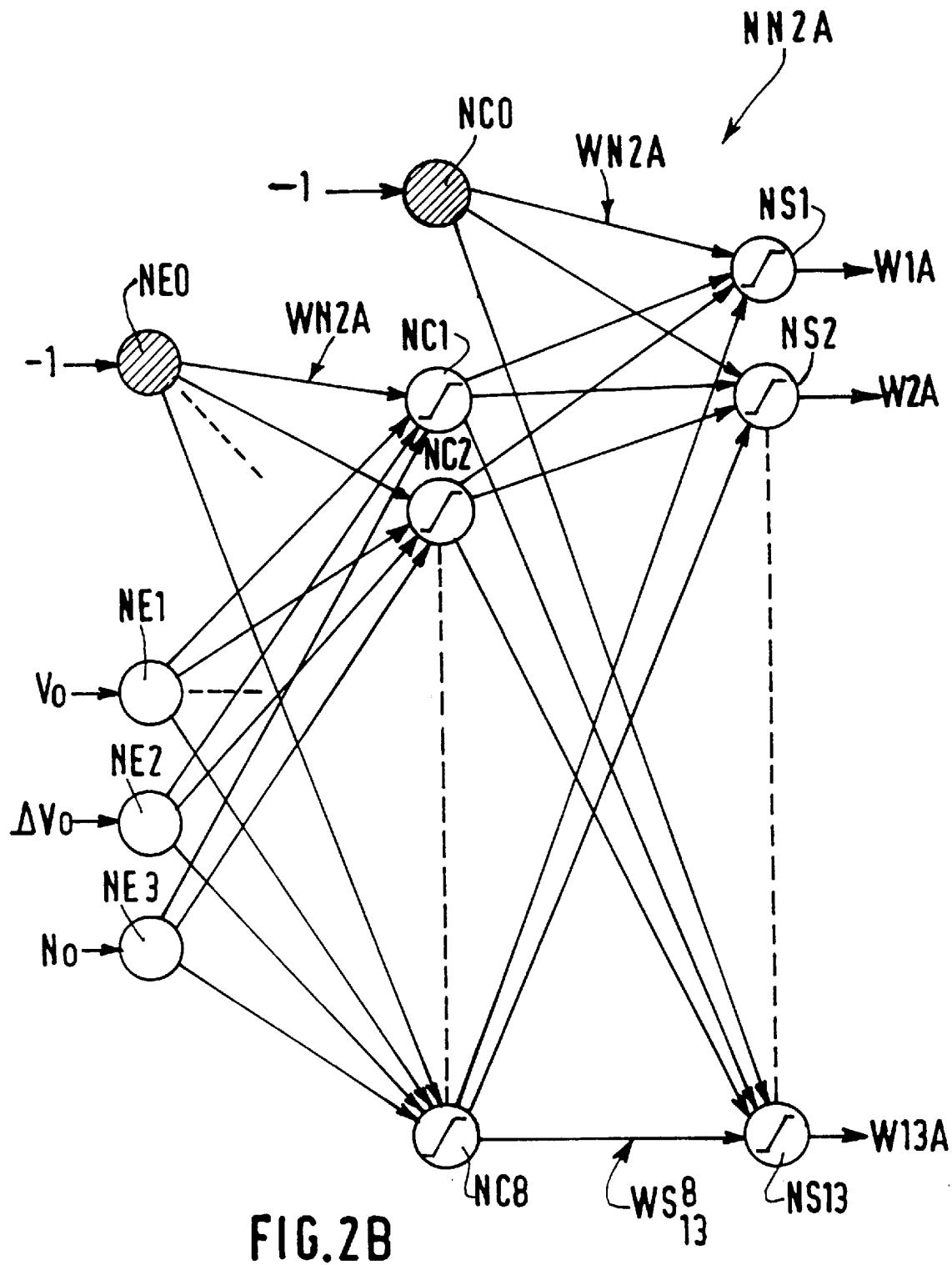
FIG. 2B represents a second neural network NN2A for this first monitoring system.

With reference to FIG. 2B, the structure of the second neural network NN2A is dictated by its task. This neural network NN2A comprises:

in input layer having three input cells NE1, NE2, NE3, for the values Vo, $\Delta$Vo and No, plus an input cell NEO for a threshold of $-1$;

thirteen output cells NS1 to NS13 for each of the thirteen weights WjB to be calculated;

a single hidden layer having eight hidden neural cells denoted NC1 to NC8, plus a hidden cell NCO for a threshold of $-1$.

According to the invention, the inputs formed by the initial values Vo and $\Delta$Vo have been specifically chosen, because it has appeared that they were the values that were most sensitive to the characteristics of the battery.

Figure 4C:
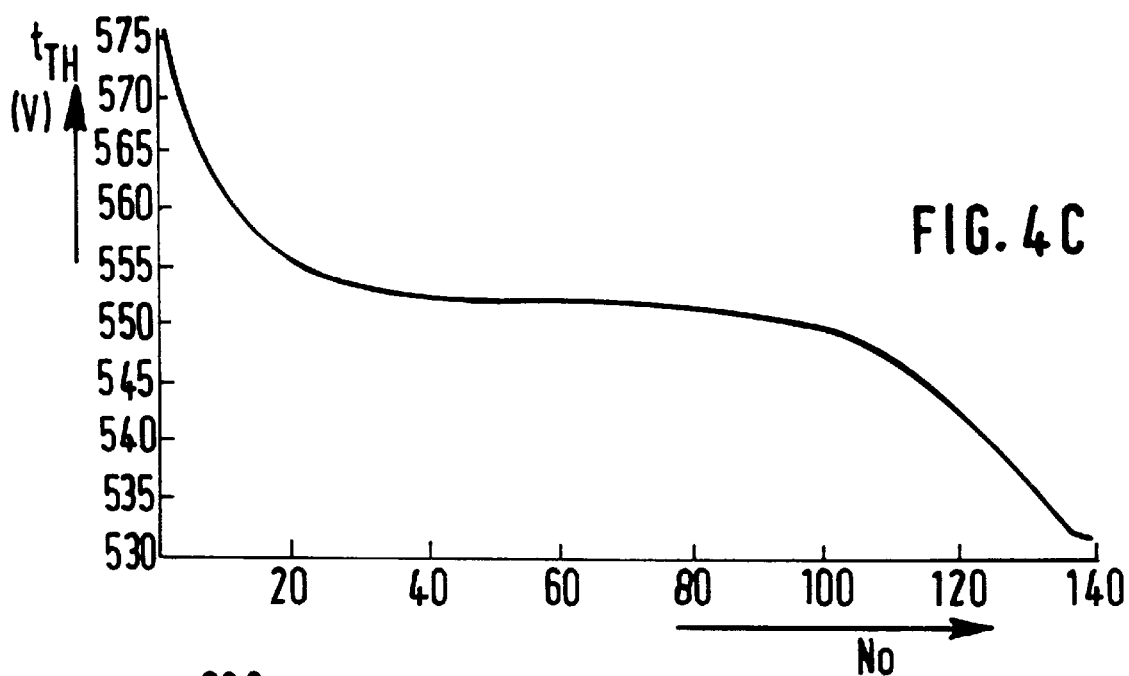
FIG. 4C represents a curve of the average discharging time of a battery plotted against the number of charging/discharging cycles.

The third input formed by the initial number No of cycles has also been specifically chosen, because this input makes it possible to take an aging effect of the battery into account, because the more a battery is subjected to charging/discharging cycles, the shorter its useful life will be, that is to say, the less the effect of recharging will be effective and the faster the discharging will be. This effect of aging is shown by FIG. 4C which shows the average discharging period $t_{TH}$ for reaching the critical threshold $V_{TH}$ from the initial instant to plotted against the initial number of cycles No.

The synaptic coefficients or weights, referenced Wn2A of this second neural network are fixed during its learning period and are stored in the ROM memory area 170a represented in FIG. 5B.

Attempts applied to the neural network NN2A have shown that such a network having 8 hidden cells, which has for its function to activate a non-linear tangential hyperbolic function "tanh" is capable of properly managing the task assigned thereto.

It should be noted that if the difference of the output cell NS of the first neural network occurs, the output cells denoted NS1 to NS13 of the second neural network NN2A have a non-linear activating function, preferably "tanh".

Like the first neural network NN1A, this second neural network NN2A has hidden cells of which the slope of the sigmoidal activating function differs from one cell to another. This embodiment makes it possible not to use a large number of hidden cells.

Thus, the second neural network is entailed in that 1400 vectors are used having thirteen weight values generated via the learning of the first neural network by means of the 2800 recorded curves, and the 1400 other generated vectors are used for the tests.

The test procedure is realized in the following manner: for the 1400 vectors that do not belong to the learning batch, the corresponding initial values Vo, $\Delta$Vo and No are applied to the inputs of the second neural network. This network calculates an output vector of thirteen weight values WjB as this network has been caused to calculate.

Following this test procedure, these thirteen weight values are imposed on a neural network NN1A, at the same time as the predetermined critical discharge voltage value $V_{TH}=6$ volts is applied to its input EC1. This first neural network NN1A thus calculates the predictive value automatically adapted to the discharging time $t_{TH}$ which is compared with that of the test curve.

Modes of Operation of the Rechargeable-Battery Monitoring System

The monitoring system 100 has two modes of operation called starting mode and current use mode.

The starting mode is utilized each time when the battery 110 has terminated a charging or recharging procedure and when it thus starts being discharged. The moment the battery 10 is put in operation, the initial voltage Vo is recorded forthwith. Then, at the instant t'o, after a very short lapse of time to$-$t'o=$\Delta$to has passed, preferably exactly 1 minute, the battery voltage is again recorded yielding a value denoted V'o, and the difference of initial voltage Vo$-$V'o=$\Delta$Vo is calculated, for example, by the calculator 160 shown in FIGS. 5A and 5B. Then, the two values Vo and $\Delta$Vo, at the same time as the initial number No of cycles that have already taken place, which number is calculated in that the calculator 160 is incremented, are applied to the input of the second neural network NN2A which then calculates the vector of 13 weight values WjA to be applied to the first neural network NN1A.

The current use mode is utilized during the discharging period itself. In this current use mode the voltage Vt need not be measured. The input EC1 of the first neural network NN1A receives the voltage $V_{TH}=6V$. The lapse of time left $\Delta t_{TH}$ before the battery reaches this predetermined critical voltage threshold is then calculated as a difference between an instant $t_{TH}$ and an instant t, where $t_{TH}$ is the output of the network NN1A when its input is set to $V_{TH}=6V$, and where t is a time measurement provided by measuring means 150a shown in FIG. 5A.

This calculation of the time difference may be performed by the first neural network NN1A, or by an individual calculation zone, or by the calculator 160 preferably formed by a microprocessor shown in FIGS. 5A and 5B.

EXAMPLE II

As shown in FIG. 1B, in a second embodiment, the monitoring system 100 comprises a first neural network referenced NN1B, and a second neural network referenced NN2B combined in series with the first neural network NN1B.

In the description that follows, a discharging period which starts at instant to, in a charging/discharging cycle is first taken into consideration; and a predetermined critical discharge voltage threshold $V_{TH}$ is fixed.

The first neural network NN1B now has two inputs for, respectively:

the predetermined critical voltage threshold $V_{TH}$, the temperature Tt of the battery at this current instant t, and has an output for producing at each current instant t, every minute:

the instant $t_{TH}$ at which this predetermined critical voltage threshold $V_{TH}$ is reached.

With reference to FIG. 5A, the first neural network NN1A is coupled to time measuring means 150a which make a measurement of each current instant t and is coupled to the calculator 160 which produces as a difference between the current instant t and the calculated value of the instant $t_{TH}$:

a value $\Delta t_{TH}$ of the lapse of time that is left until the predetermined critical discharge voltage threshold $V_{TH}$ is reached in normal operation.

The synaptic coefficients or weights WjB of this first neural network NN1B are calculated and produced automatically at each current instant t during this discharging period just as they are calculated in the first mode of operation already described.

The second neural network NN2B has three inputs for:

Vo the initial voltage measured at the initial instant to of the discharging period, $\Delta$Vo the initial variation in a short lapse of time $\Delta$to, for example, 1 minute, No the initial number of cycles, and now has seventeen outputs for seventeen weights WjB transmitted to the first neural network NN1B.

Each of the neural networks NN1B and NN2B is to be organized (or arranged) for bringing these calculations to a successful issue and producing these output signals. With this object in view, each of them is subjected to a learning procedure and to a test procedure called learning periods during which periods their synaptic coefficients are determined and, in certain cases, fixed.

Learning Procedure of the Neural Networks

The task of the first neural network NN1B is to learn discharging curve models. This learning makes it possible to form a relation between the battery discharge voltage Vt, the temperature Tt, and the current instant t at which the battery reaches this voltage Vt for this temperature Tt. The first neural network NN1B is to form, during its learning period, functions Fw which resolve the relation (1b):

$$t=Fw(Vt,Tt) \quad (1b)$$

where w assigned to F symbolizes the fact that the function F is linked with the synaptic coefficients, to the weights WjB of the first neural network NN1B.

Figure 3A:
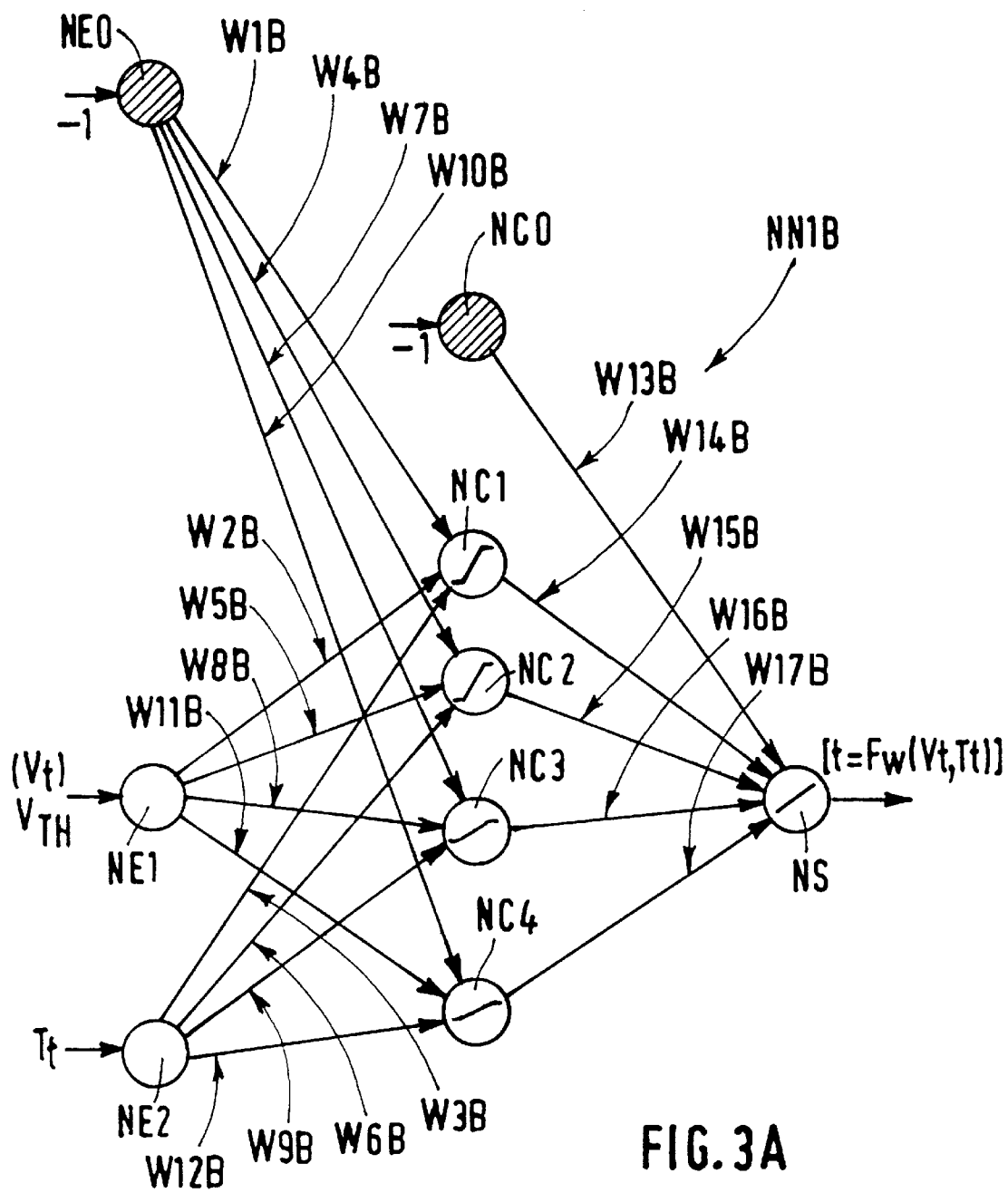
FIG. 3A represents a first neural network NN1B for a second monitoring system.

With reference to FIG. 3A, the first neural network NN1B of the monitoring system 100 comprises:

an input layer formed by three neural cells which include a first neural cell NE0 for inputting a threshold voltage fixed at −1, a second neural cell NE1 for inputting voltage value Vt at the instant t, and a third neural cell NE2 for inputting the value of the temperature Tt at this same instant t, a hidden layer of five neural cells which include a first hidden neural cell NC0 for inputting a threshold value fixed at −1, and four hidden neural cells denoted NC1 to NC4, as was the case in the first monitoring system 100, and an output layer which has a single neural cell denoted NS.

The learning and test periods of each of the two neural networks NN1B and NN2B are begun in the same manner as the learning and test periods of the neural networks NN1A and NN2A of the first embodiment of the monitoring system, except that the discharging currents are learned for various different temperatures.

The weights of this first neural network are referenced WjB and there are seventeen of them. The index "j" represents the numbers 1 to 17.

Each given hidden neuron NCi receives on the input the voltage Vt having one of the weights referenced WjB, the temperature having another one of the weights WjB, and also receives a threshold which has the constant "−1" as its value to which another one of the weights WjB is assigned. The index "i" is the index 1 to 4 of the respective hidden neural cell NC1 to NC4. Each hidden neuron NCi produces a weighted sum and calculates an intermediate output signal as described in connection with the first embodiment of the monitoring system 100.

Each hidden neuron NC1 to NC4 transfers this weighted sum via an activation function denoted Si, and calculates an Output signal denoted Si(Vt,Tt) as already described, while now the temperature is taken into consideration.

The activation function Si is still, in this second example, a sigmoidal function "tanh" representing the tangential hyperbolic function which is very well adapted to the shape of the discharging curves to be made. Thus, in the hidden layer, the four neural cells CN1 to CN4 show a non-linear function tanh.

The structure of the sole output neuron NS forms a weighted sum of the output signals Si(Vt,Tt) of all the hidden neurons NCi, by utilizing synaptic coefficients WjB, to which sum is added the value of a "−1" threshold coming from the hidden cell NC0, this threshold value being introduced in the output neuron NS via one of the synaptic coefficients WjB.

The output neuron NS transfers this weighted sum via an activation function denoted Ls, and it calculates an output signal denoted Fw(Vt,Tt). The activation, function Ls of this output neuron is linear. The output of the output neuron NS is thus the value Fw one seeks to generate.

The notations of the weights of each hidden neuron NCi are indicated in FIG. 3A as are the notations of the input weights of the output neuron NS. The set of these weights denoted W1B to W17B is formed by the set of the seventeen weights WjB transmitted by the second neural network NN2B.

Figure 4D:
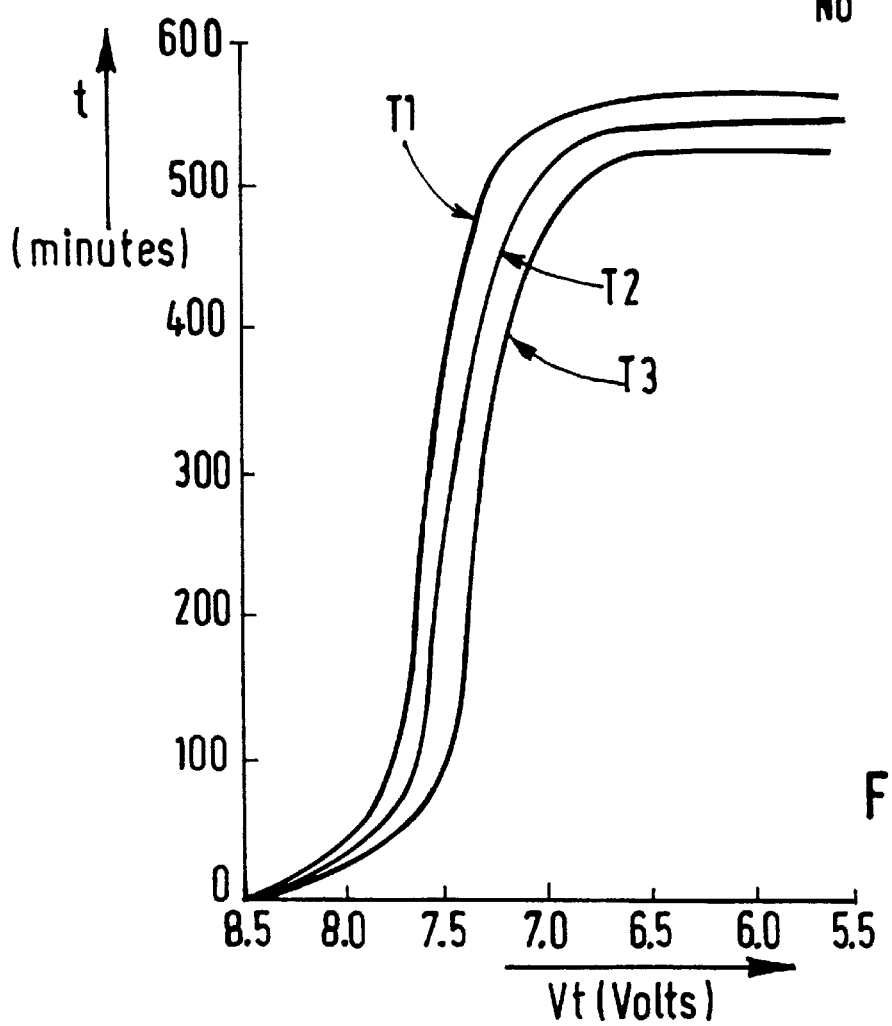
FIG. 4D represents discharging time curves of a battery plotted against voltage and against temperature.

An example of discharging curves which is interesting for the present description is represented in FIG. 4D. This curve shows time t plotted against battery voltage Vt, for various values T1, T2, T3, of the temperature T taken as a parameter. These discharging curves each have a form approaching the form of a 'tanh' curve. Therefore, the sigmoidal-type functions are preferred for realizing the activating functions in the neurons of the hidden layer.

As in the example I, the central part of the discharging curves is modelled by the two first neural cells CN1, CN2 of the hidden layer, of which the activating functions have a steep slope; whereas the end parts of these curves are modelled by the following hidden neural cells CN3, CN4 which show an activating function which has a less steep slope.

Figure 3B:
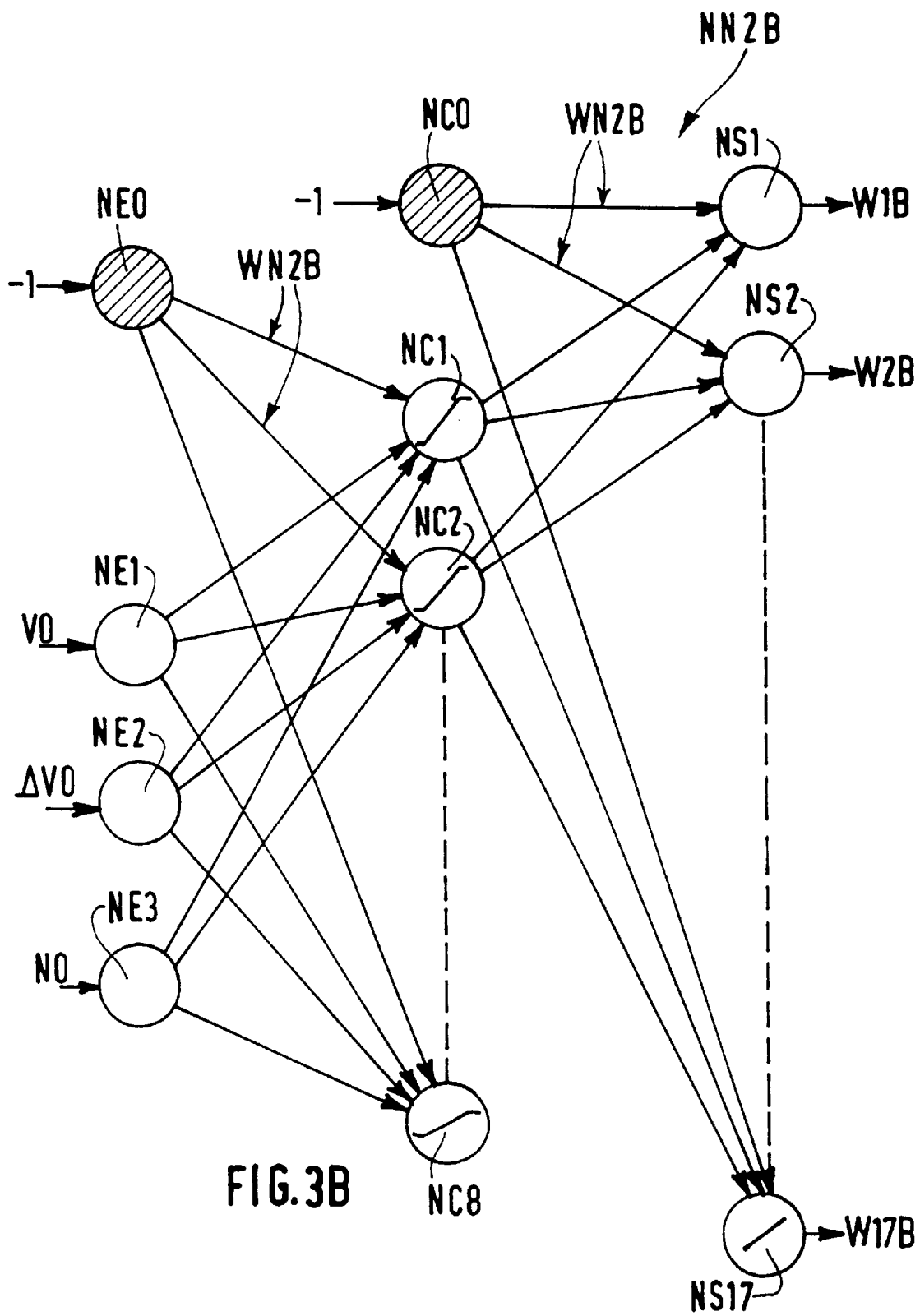
FIG. 3B represents a second neural network NN2B for the second monitoring system.

In this example II, with reference to FIG. 3B, the task of the second neural network NN2B is to learn a relation between parameters during the discharge voltage of the battery. Thus, the second neural network NN2B receives No the number of previous cycles called initial number of charging/discharging cycles, Vo the first voltage recorded of a given discharging curve, and ΔVo the slope at the start of this discharging curve, and is to be capable of calculating on the basis of these measurements, the seventeen weights WjB which are necessary for the operation of the first neural network NN1B. This relation is expressed in the function (4b):

$$WjB = G(Vo, \Delta Vo, No) \qquad (4b)$$

With reference to FIG. 3B, the structure of the second neural network NN2B is dictated by its task. This network NN2B comprises:

an input layer having three input cells NE1, NE2, NE3 for the values Vo, ΔVo and No, plus an input cell NE0 for a threshold of −1;

seventeen output cells for each of the respective seventeen weights WjB to be calculated;

a single hidden layer having eight hidden neural cells denoted NC1 to NC8, plus a hidden cell NC0 for a threshold of −1.

In this example II, the entailment of the neural networks and their operating mode and current use is the same as in the example I when taking into account the input signal Tt of the first neural network NN1B.

EXAMPLE III

In an embodiment of the monitoring system of the charging state of a battery, the first neural network can provide on the output, independently, either an indication of the instant $t_{TH}$ where the critical voltage threshold value $V_{TH}$ is reached, or an indication of the lapse of time left, or the two indications.

Actually, the indication of the instant $t_{TH}$ is calculated of necessity in the so-termed current use mode, when the input of the first neural network NN1A or NN1B is set to the threshold value $V_{TH}=6V$ to be able to calculate the lapse of time $\Delta t_{TH}$ as a difference between the instant t and the instant $t_{TH}$. This difference can also be calculated in addition to the first neural network by the calculator denoted 160 in the FIGS. 5A and 5B. This indication of the instant $t_{TH}$ can thus be given to the user of the host system by suitable display means 140 displaying what time it is.

Moreover, after a discharging period, the battery is to undergo a charging period which is completed when the voltage in the battery reaches the initial value Vo, which is, for example, 9 volts. In this example the display means may display that the recharging of the battery has terminated.

EXAMPLE IV

With reference to FIG. 5A, of which the legend is stated in Table I, the monitoring system 100 is used by a microprocessor 160 to carry out the calculations, and memory areas 170a, 170b are used for storing the data. These memory areas are accessible via the microprocessor 160 and include a ROM memory area 170a for storing the structure data of the first and second neural networks NN1A, NN2A, NN1B, NN2B, the fixed parameters and the weights WN2A, WN2B of the second neural network, and a RAM memory area 170b for recording or producing, as the case may be, the variable measurements and the weight vectors WjA, WjB of the first and second neural networks. The microprocessor 160 carries out the calculations necessary for the operation of the monitoring system.

With reference to FIG. 5B, of which the legend is stated in Table II, the monitoring system 100 is coupled to display means 140 for giving the user an indication of time $t_{TH}$ or also of the lapse of time $\Delta t_{TH}$ that is left from a current instant t of use onwards until the instant at which the battery will reach this predetermined critical voltage threshold $Vt_{TH}$, or also the two indications. The display means 140 may furthermore display the time, that is to say, an indication of the exact current instant t; these display means may further display an indication in a recharging period of the battery that this recharging period has terminated, when the battery has reached the initial voltage Vo.

As stated above, the monitoring system 100 forms part of a host device 130 which comprises connection means D1, D2 for the rechargeable battery 110. The rechargeable battery 110 is coupled to the monitoring system 100 to form the smart battery 120. The host device 130 further accommodates the measuring means 150, for example, a multimeter, the microprocessor 160, the memory areas 170a, 170b which are accessible via the microprocessor, and the display means 140.

For realizing the display means, various devices known from the state of the art can be used. A device may be a screen with indications written on it, or with indications drawn on it, or also a panel formed by diodes.

TABLE 1

(FIG. 5A)

| | |
|---|---|
| 150a | Measuring means for time $t_o$, $t'_o$, $t$ |
| 150b | Measuring means for voltage $V_o$, $V'_o$, Vt |
| 150c | Measuring means for temperature Tt |
| 110 | Rechargeable battery |
| 160 | Microprocessor for performing the calculations $\Delta t_{TH} = t - t_{TH}$, $\Delta Vo = Vo - V'o$, No |
| NN1A<br>NN1B | } First neural network |
| NN2A<br>NN2B | } Second neural network |
| 170 | Memory areas |

TABLE II (FIG. 5B)

| | |
|---|---|
| 130 | Host Device |
| D1, D2 | Connection of the host device and of the battery |
| 110 | Rechargeable battery |
| 150 | Time, temperature and voltage measuring means |
| 160 | Microprocessor for performing the calculations |
| 170a | ROM memory area |
| 170b | RAM memory area |
| 100 | Battery monitoring system |
| 120 | Smart battery |
| 140 | Display means for displaying the current instant and calculated times, and possibly the end of the charging period. |

What is claimed is:

1. A monitoring system for monitoring the discharging period of the charging/discharging cycles of a battery, coupled to a rechargeable battery which has charging periods alternating with discharging periods as a function of charging/discharging cycles, this system comprising:

first adaptive calculation means which are arranged for collecting, at an initial instant (to) at the beginning of a discharging period of a charging/discharging cycle of the battery, a predetermined value of a critical discharge voltage threshold ($V_{TH}$), and for calculating and providing a predictive indication of a critical instant ($t_{TH}$) at which the battery will reach this predetermined critical discharge voltage threshold ($V_{TH}$), second adaptive calculation means coupled to the first calculation means, which are arranged for collecting, at the initial instant (to), a measured value of an initial voltage (Vo), of an initial variation (ΔVo) of the voltage at a later instant (t'o) after a short lapse of time (Δto) starting from this initial instant (to) onwards, and of the initial number (No) of charging/dischargirg cycles of this battery effected before this initial instant (to), and arranged for calculating and producing from the instant (to+Δto) of said discharging period at which the initial values are available onwards, operating parameters which are automatically adapted to the values of the initial measurements and imposed on the first calculation means to improve the accuracy thereof.

2. A monitoring system as claimed in claim 1, in which the first adaptive calculation means are also arranged for collecting, at a current instant (t) during the respective discharging period of the charging/discharging cycle of the battery in operation, a temperature measurement (Tt), and for calculating and providing at this current instant (t) a predictive indication of a critical instant ($t_{TH}$) at which the battery will reach the predetermined critical discharge voltage threshold ($V_{TH}$).

3. A monitoring system as claimed in claim 1, in which:
the first adaptive calculation means are also arranged for calculating and providing at each current instant (t) a predictive indication of the lapse of time ($\Delta t_{TH}$) that is left from this current instant (t) onwards until the critical instant ($t_{TH}$) at which the battery will reach the predetermined critical discharge voltage threshold ($V_{TH}$), or a predictive indication of this critical instant ($t_{TH}$).

4. A monitoring system as claimed in claim 1, in which the adaptive calculation means are formed by:
a first neural network (NN1A) arranged for calculating and providing at each current instant (t) a predictive indication of the critical instant ($t_{TH}$) at which the battery will reach this predetermined critical discharge voltage threshold ($V_{TH}$), on the basis of the predetermined critical discharge voltage threshold ($V_{TH}$),
a second neural network (NN2A), combined in series with the first neural network, arranged for calculating and providing automatically adapted synaptic weights (WjB) imposed on the first neural network, on the basis of the initial measurement of the voltage values (Vo), of the initial voltage variation (ΔVo) and of the initial number of cycles (No), with each start of a discharging period of each discharging cycle, from the instant (to+Δto) of the respective period onwards at which the initial measurements are available.

5. A monitoring system as claimed in claim 2, in which the adaptive calculation means are formed by:
a first neural network (NN1B) arranged for calculating and providing at each current instant (t) a predictive indication of the critical instant ($t_{TH}$) at which the battery will reach this predetermined critical discharge voltage threshold ($V_{TH}$), on the basis of the predetermined critical discharge voltage threshold ($V_{TH}$), and on the basis of the temperature measurement (Tt),
a second neural network (NN2B), combined in series with the first neural network, arranged for calculating and providing automatically adapted synaptic weights (WjB) imposed on the first neural network, on the basis of the initial measurement of the voltage values (Vo), of the initial voltage variation (ΔVo) and of the initial number of cycles (No), with each start of a discharging period of each discharging cycle, from the instant (to+Δto) of the respective period onwards at which the initial measurements are available.

6. A monitoring system as claimed in claim 4, in which:
the first neural network is arranged for calculating and providing at each current instant (t) a predictive indication of the lapse of time ($\Delta t_{TH}$) that is left from this current instant (t) onwards until the critical instant ($t_{TH}$) at which the battery will reach this predetermined critical discharge voltage threshold ($V_{TH}$), on the basis of the predetermined critical discharge voltage threshold ($V_{TH}$), and possibly on the basis of the temperature measurement (Tt).

7. A monitoring system as claimed in claim 4, in which the first neural network (NN1) has three layers, of which one layer of two or three input cells for a threshold, a voltage value and possibly a temperature value respectively, one layer of hidden cells and an output cell, the cells of the hidden layer having a sigmoidal activating function with different slopes from one cell to another, and the cell of the output layer having a linear activating function.

8. A monitoring system as claimed in claim 7, in which the second neural network has three neural cell layers, of which one layer of four input cells for a threshold, and each of the initial values respectively, one layer of hidden cells, and one layer of output cells, the cells of the hidden layer having a sigmoidal activating function with different slopes from one cell to another, and the cells of the output layer having a like quantity to the number of synaptic coefficients which are necessary for the operation of the first neural network and having a sigmoidal activating function.

9. A monitoring system as claimed in claim 4, this system being coupled to a host device, and in this host device to a rechargeable battery, to time measuring means, voltage measuring means, and optionally to temperature measuring means, and to display means arranged for providing either an indication of the critical instant ($t_{TH}$) at which the battery will reach the critical voltage threshold ($vt_{TH}$), or an indication of the lapse of time ($\Delta t_{TH}$) that is left from a current instant of use (t) onwards until the instant ($t_{TH}$) at which the battery will reach a predetermined critical voltage threshold ($Vt_{TH}$), or the two indications, and optionally an indication of the end of the recharging period of the battery.

10. A monitoring system as claimed in claim 9, comprising a microprocessor for carrying out the calculations, and memory areas for storing the data, these memory areas being accessible via the microprocessor and including a ROM memory area for storing the structure data of the neural networks, the fixed parameters and the synaptic coefficients of the second neural network, and a RAM memory area for recording or producing the variable measurements and the synaptic coefficients of the first neural network.

11. A host device supplied with power by a rechargeable battery, coupled to a monitoring system as claimed in claim 1, this device further including, coupled to this system, time measuring means, voltage measuring means, optionally temperature measuring means, and display means arranged for providing either an indication of the critical instant ($t_{TH}$) at which the battery will reach the critical voltage threshold ($vt_{TH}$), or an indication of the lapse of time ($\Delta t_{TH}$) that is left from a current instant of use (t) onwards until the instant at which the battery will reach a predetermined critical voltage threshold ($V_{TH}$), or the two indications, and arranged for providing an indication of the end of the charging of the battery in a recharging period.

12. A host device as claimed in claim 11, in which the monitoring system comprises, for realizing the first and second calculation means, a microprocessor for carrying out the calculations, and memory areas for storing the data, these memory areas being accessible via the microprocessor and including a ROM memory area for storing the structure data of the first and second calculation means, the fixed parameters and the operation parameters of the second calculation means, and a RAM memory area for recording or producing the variable measurements and the operation parameters of the first calculation means.

13. A method of producing neural networks of the monitoring system as claimed in claim 7, comprising in a learning period:
   the learning by the first neural network, of discharging time curves (t) as a function of the discharge voltage (Vt) and possibly the temperature (Tt) as parameters, during which period discharge voltages (Vt) are imposed on the input of the first neural network normally intended for the voltage value, and the corresponding instants are imposed on the output for forming a data base formed by vectors of the synaptic coefficients (WjA,WjB) of this first neural network,
   the learning by the second neural network of relations between the initial values (Vo, ΔVo, No) and the synaptic coefficients (WjA,WjB) determined in its learning period of the first neural network, for determining and fixing its own synaptic coefficients.

14. A monitoring system as claimed in claim 2, in which:
   the first adaptive calculation means are also arranged for calculating and providing at each current instant (t) a predictive indication of the lapse of time ($\Delta t_{TH}$) that is left from this current instant (t) onwards until the critical instant ($t_{TH}$) at which the battery will reach the predetermined critical discharge voltage threshold ($V_{TH}$), or a predictive indication of this critical instant ($t_{TH}$).

15. A monitoring system as claimed in claims 5, in which:
   the first neural network is arranged for calculating and providing at each current instant (t) a predictive indication of the lapse of time ($\Delta t_{TH}$) that is left from this current instant (t) onwards until the critical instant ($t_{TH}$) at which the battery will reach this predetermined critical discharge voltage threshold ($V_{TH}$), on the basis of the predetermined critical discharge voltage threshold ($V_{TH}$), and possibly on the basis of the temperature measurement (Tt).

16. A monitoring system as claimed in claim 15, in which the first neural network has three layers, of which one layer of two or three input cells for a threshold, a voltage value and possibly a temperature value respectively, one layer of hidden cells and an output cell, the cells of the hidden layer having a sigmoidal activating function with different slopes from one cell to another, and the cell of the output layer having a linear activating function.

17. A monitoring system as claimed in claim 16, in which the second neural network has three neural cell layers, of which one layer of four input cells for a threshold, and each of the initial values respectively, one layer of hidden cells, and one layer of output cells, the cells of the hidden layer having a sigmoidal activating function with different slopes from one cell to another, and the cells of the output layer having a like quantity to the number of synaptic coefficients which are necessary for the operation of the first neural network and having a sigmoidal activating function.

18. A monitoring system as claimed in claim 17, this system being coupled to a host device, and in this host device to a rechargeable battery, to time measuring means, voltage measuring means, and optionally to temperature measuring means, and to display means arranged for providing either an indication of the critical instant ($t_{TH}$) at which the battery will reach the critical voltage threshold ($vt_{TH}$), or an indication of the lapse of time ($\Delta t_{TH}$) that is left from a current instant of use (t) onwards until the instant ($t_{TH}$) at which the battery will reach a predetermined critical voltage threshold ($Vt_{TH}$), or the two indications, and optionally an indication of the end of the recharging period of the battery.

19. A host device supplied with power by a rechargeable battery, coupled to a monitoring system as claimed in claim 10, this device further including, coupled to this system, time measuring means, voltage measuring means, optionally temperature measuring means, and display means Arranged for providing either an indication of the critical instant ($t_{TH}$) at which the battery will reach the critical voltage threshold ($vt_{TH}$), or an indication of the lapse of time ($\Delta t_{TH}$) that is left from a current instant of use (t) onwards until the instant at which the battery will reach a predetermined critical voltage threshold ($V_{TH}$), or the two indications, and arranged for providing an indication of the end of the charging of the battery in a recharging period.

20. A method of producing neural networks of the monitoring system as claimed in claim 17, comprising in a learning period:
   the learning by the first neural network, of discharging time curves (t) as a function of the discharge voltage (Vt) and possibly the temperature (Tt) as parameters, during which period discharge voltages (Vt) are imposed on the input of the first neural network normally intended for the voltage value, and the corresponding instants are imposed on the output for forming a data base formed by vectors of the synaptic coefficients (WjA,WjB) of this first neural network,
   the learning by the second neural network of relations between the initial values (Vo, ΔVo, No) and the synaptic coefficients (WjA,WjB) determined in its learning period of the first neural network, for determining and fixing its own synaptic coefficients.

* * * * *